(12) United States Patent
Imahori

(10) Patent No.: US 11,052,926 B2
(45) Date of Patent: Jul. 6, 2021

(54) OVERHEAD TRANSPORT SYSTEM AND OVERHEAD TRANSPORT VEHICLE

(71) Applicant: Murata Machinery, Ltd., Kyoto (JP)

(72) Inventor: Fuyuki Imahori, Inuyama (JP)

(73) Assignee: Murata Machinery, Ltd., Kyoto (JP)

(*) Notice: Subject to any disclaimer, the term of this patent is extended or adjusted under 35 U.S.C. 154(b) by 0 days.

(21) Appl. No.: 16/335,849

(22) PCT Filed: Jul. 18, 2017

(86) PCT No.: PCT/JP2017/025902
§ 371 (c)(1),
(2) Date: Mar. 22, 2019

(87) PCT Pub. No.: WO2018/055883
PCT Pub. Date: Mar. 29, 2018

(65) Prior Publication Data
US 2019/0217873 A1    Jul. 18, 2019

(30) Foreign Application Priority Data

Sep. 26, 2016    (JP) .............................. JP2016-186750

(51) Int. Cl.
*B65G 37/02*    (2006.01)
*B61B 3/00*    (2006.01)
(Continued)

(52) U.S. Cl.
CPC ............... *B61B 3/00* (2013.01); *B65G 37/02* (2013.01); *B66C 1/28* (2013.01);
(Continued)

(58) Field of Classification Search
CPC ....... B65G 1/0414; B65G 37/02; B60P 3/062; B61B 3/00; B66C 1/28
(Continued)

(56) References Cited

U.S. PATENT DOCUMENTS 6,885,911 B1 *    4/2005    Smith ................ G11B 15/6835
                                                104/88.02
7,516,859 B2 *    4/2009    Taniguchi ............ B65G 1/0435
                                                212/331
(Continued)

FOREIGN PATENT DOCUMENTS

JP    2006-282303 A    10/2006
JP    2006-282382 A    10/2006
(Continued)

OTHER PUBLICATIONS

Written Opinion dated Mar. 29, 2018, of counterpart International Application No. PCT/JP2017/025902, along with a Machine English translation.
(Continued)

*Primary Examiner* — Saul Rodriguez
*Assistant Examiner* — Willie Berry, Jr.
(74) *Attorney, Agent, or Firm* — DLA Piper LLP (US)

(57) ABSTRACT

An overhead transport system includes a first placement part that can have placed thereon an article held by an article holder in a state where the article is placed thereon, and also articles do not interfere with each other when the article holder and a lift driver are projected; a second placement part that can have placed thereon the article held by the article holder in a state where the article holder and the lift driver have been projected by the second projection length by the lateral extender; and a third placement part arranged below the track and can have placed thereon an article held by the article holder, wherein the first and third placement parts are provided at the same height.

19 Claims, 10 Drawing Sheets

(51) Int. Cl.
*B66C 1/28* (2006.01)
*H01L 21/677* (2006.01)
(52) U.S. Cl.
CPC .. *H01L 21/67733* (2013.01); *H01L 21/67736* (2013.01); *H01L 21/67769* (2013.01)
(58) Field of Classification Search
USPC ................................ 414/626, 411, 217, 282
See application file for complete search history.

(56) References Cited

U.S. PATENT DOCUMENTS

| | | | |
|---|---|---|---|
| 7,753,639 B2* | 7/2010 | Hoshino | B65G 1/0457 414/270 |
| 2006/0219126 A1 | 10/2006 | Nakao | |
| 2006/0222479 A1 | 10/2006 | Shiwaku et al. | |
| 2007/0224026 A1* | 9/2007 | Chang | H01L 21/67706 414/626 |
| 2010/0174405 A1 | 7/2010 | Doherty et al. | |
| 2012/0114453 A1 | 5/2012 | Ota et al. | |
| 2012/0128452 A1 | 5/2012 | Murata et al. | |

FOREIGN PATENT DOCUMENTS

| | | |
|---|---|---|
| JP | 2012-114406 A | 6/2012 |
| JP | 5729415 B2 | 6/2015 |
| WO | 2012/014561 A1 | 2/2012 |

OTHER PUBLICATIONS

International Preliminary Report on Patentability dated Aug. 24, 2018, of counterpart International Application No. PCT/JP2017/025902.

English translation of the International Preliminary Report on Patentability of counterpart International Application No. PCT/JP2017/025902, dated Feb. 28, 2019.

* cited by examiner

OVERHEAD TRANSPORT SYSTEM AND OVERHEAD TRANSPORT VEHICLE

TECHNICAL FIELD

This disclosure relates to an overhead transport system and an overhead transport vehicle.

BACKGROUND

In manufacturing factories such as semiconductor manufacturing factories, an overhead transport vehicle that travels along a rail installed on a ceiling is used to transport, for example, articles such as transportation containers (FOUPs) for semiconductor wafers and reticle pods for transporting reticles. In such manufacturing factories, a storage area that temporarily stores articles is often installed on the floor surface and, as a result, space on the floor surface is occupied by the storage. For this reason, in recent years, an overhead transport system has been proposed in which placement parts on which articles can be placed are arranged along a traveling route of an overhead transport vehicle and the articles are stored in the vicinity of the ceiling (for example, see Japanese Patent No. 5729415).

In the overhead transport system disclosed in Japanese Patent No. 5729415, the placement parts are arranged in line along the traveling route of the overhead transport vehicle below the rail. Also, a configuration has also been proposed in which the placement parts are arranged in line along the traveling route below and on the side of the rail. However, even with the placement parts below the rail and the placement parts below and on the side of the rail combined, there is a limitation in the number of the placement parts that can be installed, and it is difficult to increase the number of articles that can be stored. Moreover, in the building of a factory or the like, space in the vicinity of the ceiling is often available for use, and there is a demand for effective utilization of that space to reduce the number of storage accommodations on the floor surface.

It could therefore be helpful to provide an overhead transport system capable of increasing the number of articles that can be stored in the vicinity of a ceiling by increasing, toward a side of a track, the number of placement parts on which the articles can be placed, and an overhead transport vehicle.

SUMMARY

I thus provide:

An overhead transport system comprising: a track installed on a ceiling or in the vicinity of the ceiling; an overhead transport vehicle that travels along the track and includes an article holder that holds an article, a lift driver that lifts or lowers the article holder, and a lateral extender capable of projecting the article holder and the lift driver toward a side of the track; a first placement part arranged below and on the side of the track, that can have placed thereon an article held by the article holder in a state where the article holder and the lift driver have been projected by a first projection length by the lateral extender, and is set to a height at which the article holder and the lift driver can be projected by a second projection length longer than the first projection length, by the lateral extender while the article is held by the article holder, in a state where the article is placed thereon, and articles do not interfere with each other when the article holder and the lift driver are projected; and a second placement part arranged below and on the side of the track and on an outer side of the first placement part, and can have placed thereon the article held by the article holder in a state where the article holder and the lift driver have been projected by the second projection length by the lateral extender.

The first placement part may be arranged lower, by more than a total height of two of the articles, than a reference, which is the article holder in a state of being projected toward the side of the track by the first projection length. A plurality of the first placement parts may be arranged toward the side of the track. The second placement part may be arranged above the first placement part. The second placement part may be arranged above an upper end of the article placed on the first placement part. The second placement part may be arranged at the same position as that of the first placement part in a direction along the track. The first placement part and the second placement part may each be provided on a frame suspended from the ceiling. There may be included a third placement part arranged below the track and can have placed thereon the article held by the article holder. The third placement part may be arranged below the first placement part.

Further, I provide an overhead transport vehicle to be used in the above overhead transport system.

According to my overhead transport system, the lateral extender can transfer an article to and from each of the first placement part and the second placement part arranged toward the side of the track. Thereby, the number of placement parts on which articles can be placed can be increased toward the side of the track. As a result, it is possible to increase the number of articles that can be stored on a ceiling or in the vicinity of the ceiling. Furthermore, the lateral extender can project the article holder and the lift driver to the second placement part without interfering with the article placed on the first placement part. As a result, it is possible to transfer an article to the second placement part, which is distanced from the overhead transport vehicle, regardless of whether or not another article is placed on the first placement part.

In the overhead transport system in which the first placement part is arranged lower, by more than the total height of two of the articles, than a reference, which is the article holder in a state of being projected toward the side of the track by the first projection length, the article holder and the lift driver can be reliably projected by the second projection length without interfering with the article placed on the first placement part. Also, in the overhead transport system in which a plurality of the first placement parts are arranged toward the side of the track, it is possible to increase the number of the articles that can be stored on the ceiling or in the vicinity of the ceiling. In the overhead transport system in which the second placement part is arranged above the first placement part, the length of lifting and lowering of the article can be reduced when transferring the article to the second placement part, thereby improving the transfer efficiency of the articles.

Furthermore, in the overhead transport system in which the second placement part is arranged above the upper end of the article placed on the first placement part, it is possible to reliably prevent the article held by the article holder from interfering with the article placed on the first placement part while the lateral extender is being projected by the second projection length. In the overhead transport system in which the second placement part is arranged at the same position as that of the first placement part in the direction along the track, the first placement part and the second placement part are not arranged out of alignment with the direction along the track so that the first placement part and the second placement part can be arranged in a space efficient manner. In the overhead transport system in which the first placement part and the second placement part are each provided on a frame suspended from the ceiling, the first placement part and the second placement part are each arranged on the frame so that the first placement part and the second placement part can be efficiently arranged. In the first placement part and the second placement part that include the third placement part arranged below the track and can have placed thereon an article held by the article holder, it is possible to further increase the number of articles that can be stored on the ceiling or in the vicinity of the ceiling. In the overhead transport system in which the third placement part is arranged below the first placement part, the first placement part is arranged above while the article placed on the third placement part avoids interference with the overhead transport vehicle so that it is possible to reduce the length of lifting and lowering of the article to and from the first placement part, and improve the transfer efficiency of the articles.

According to the overhead transport vehicle, in the overhead transport system mentioned above, the article can be transferred to the first placement part or the second placement part and, furthermore, it is possible to ensure versatility that enables transferring of the article also to a conventional storage or the like.

DESCRIPTION OF REFERENCE SIGNS

Figure 1:
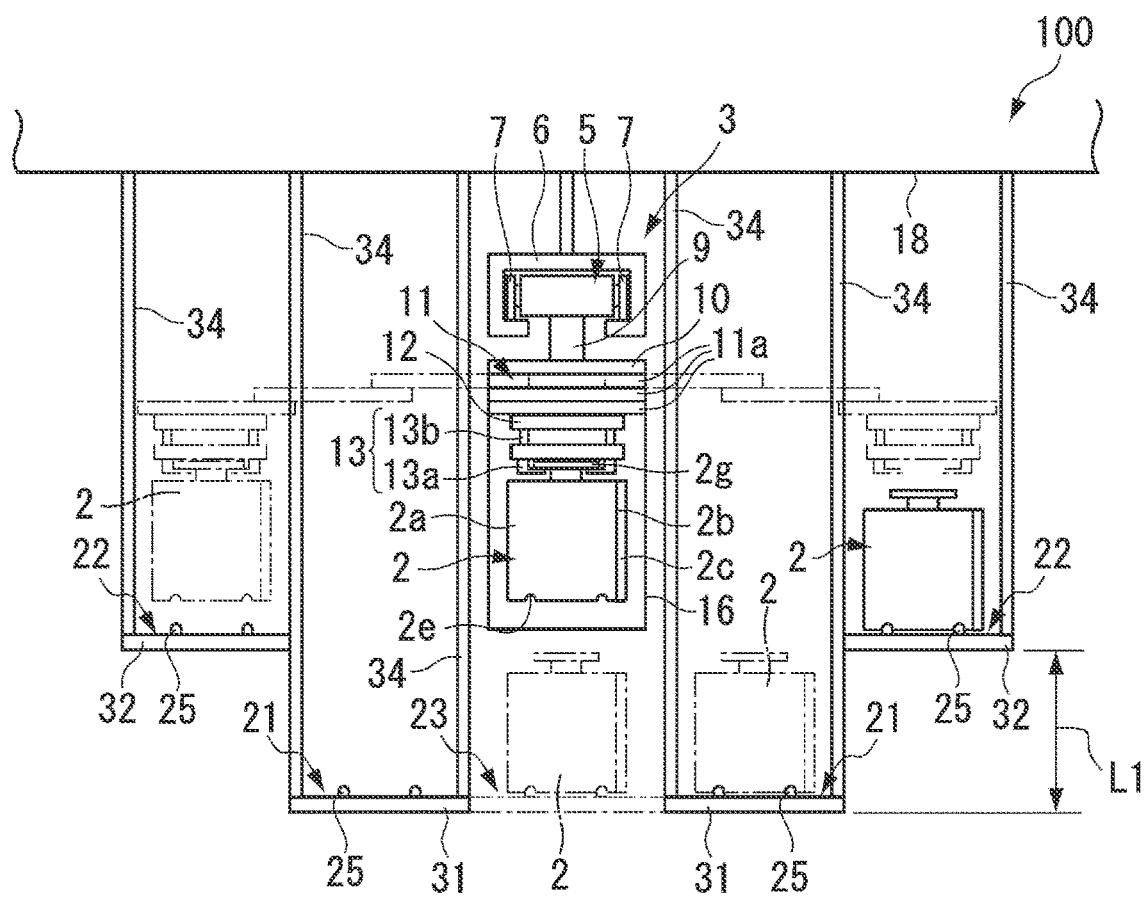
FIG. 1 is a front elevation view showing an example of an overhead transport system and an overhead transport vehicle according to a first example.

L1, L2, L3, L4 Distance
R1 First projection length
R2 Second projection length
2 Article
3 Overhead transport vehicle
5 Traveling driver
6 Traveling rail
11 Lateral extender
12 Lift driver
13 Article holder
16 Cover
18 Ceiling
21 First placement part
22 Second placement part
23 Third placement part
31 First frame (frame)
32 Second frame (frame)
131 Frame
100, 100A, 100B, 100C, 200 Overhead transport system

DETAILED DESCRIPTION

The following describes examples with reference to the drawings. However, this disclosure is not limited to the examples. In the drawings, scale is changed as necessary to illustrate the examples such as by enlarging and emphasizing a part. In the following drawings, an XYZ coordinate system is used to describe the directions in each drawing. In the XYZ coordinate system, a plane parallel to a horizontal plane is defined as an XY plane. A direction perpendicular to the XY plane is denoted as a Z direction. For each of the X direction, the Y direction, and the Z direction, description is made with a definition in which a direction indicated by an arrow is the positive (+) direction and a direction opposite to the direction indicated by the arrow is the negative (−) direction.

First Example

Figure 2:
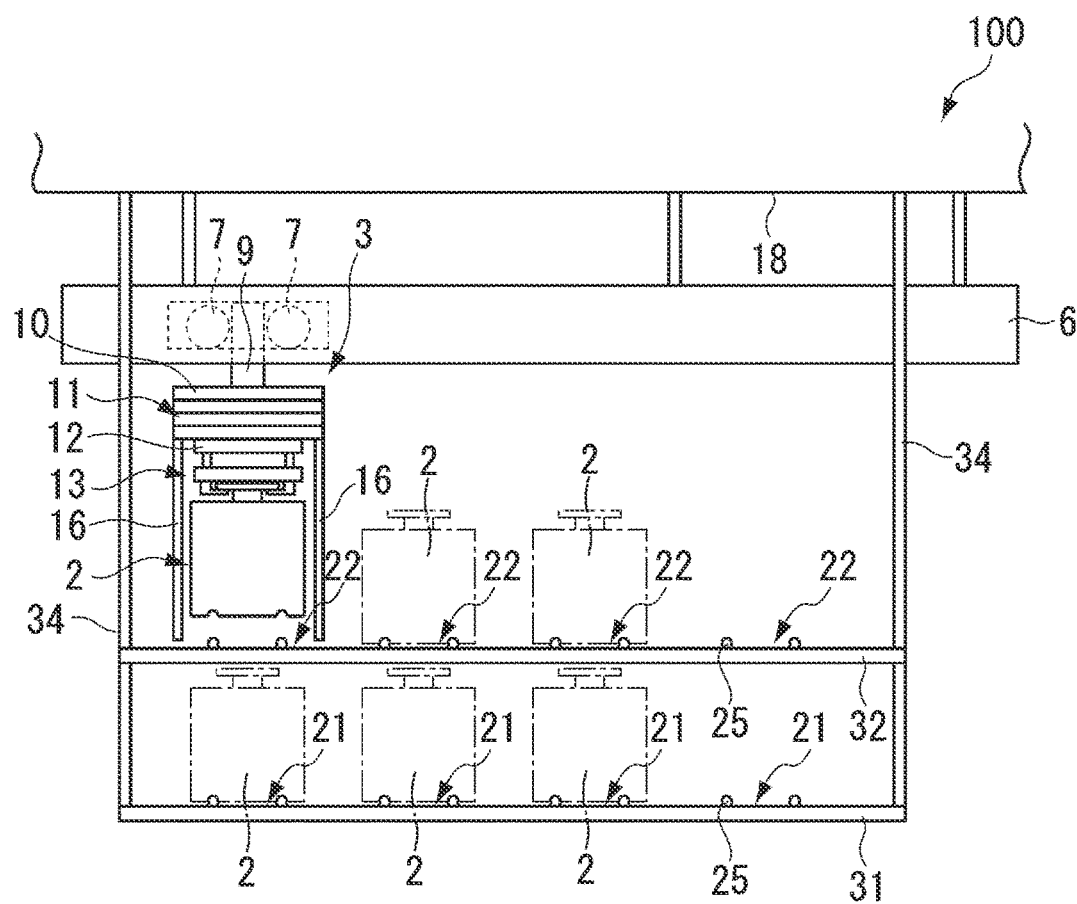
FIG. 2 is a side view of the overhead transport system and the overhead transport vehicle shown in FIG. 1.

FIG. 1 and FIG. 2 are diagrams showing a first example of an overhead transport system 100. FIG. 1 is a front elevation view, and FIG. 2 is a side view. The overhead transport system 100 includes an overhead transport vehicle 3, first placement parts 21, second placement parts 22, and third placement parts 23. The overhead transport system 100 is installed in, for example, a semiconductor device manufacturing factory. The overhead transport system 100 is capable of holding and transporting an article 2 by the overhead transport vehicle 3 and also allows the articles 2 to be placed by the overhead transport vehicle 3 onto the first placement part 21, the second placement part 22, and the third placement part 23 to store the articles 2. It is optional whether or not to provide the third placement part 23 and, therefore, it is represented by a dashed line in FIG. 1.

The article 2 is, for example, a container that accommodates articles such as wafers and reticles used to manufacture semiconductor devices. The article 2 serving as a transportation container is, for example, a FOUP, a SMIF pod, a reticle pod or the like, the interior of which can be purged with a purge gas that is inactive to the accommodated object such as nitrogen gas and clean dry air. An example is shown where the article 2 is a FOUP.

The article 2 includes a main body 2a, an opening 2b, and a lid 2c that closes the opening 2b. The opening 2b is provided on a side surface of the main body 2a and is formed to open in a horizontal direction (+Y direction in FIG. 1). The accommodated object such as wafers accommodated in the article 2 is taken in or out of the interior of the article 2 through the opening 2b. The lid 2c is provided on the article 2 in an attachable/detachable manner to close the opening 2b. The lid 2c is attached to or detached from the main body 2a, for example, by various types of attachers/detachers. In the first example, the lid 2c is arranged on the +Y side of the article 2. Moreover, in the article 2, recesses 2e are provided on a bottom surface of the main body 2a, and a flange 2g is provided at the top of the main body 2a. The recesses 2e are provided as a plurality of (for example, three) grooves in a pattern radiating from the center of the bottom surface to fit onto a plurality of (for example, three) pins 25 described later. The flange 2g is formed in a shape that can be held by an article holder 13 described later.

The article 2 is transported to a processing apparatus (not shown in the figure) by a transporter such as the overhead transport vehicle 3 and is transported from the processing apparatus. Examples of the processing apparatus include a film former, a coater/developer, an exposurer, and an etcher for processing semiconductor wafers, and the processing apparatus performs various processes in the course of manufacturing various types of devices (for example, semiconductor devices).

The overhead transport vehicle 3 includes an article holder 13 that holds the article 2, a lift driver 12 that lifts and lowers the article holder 13 in the vertical direction, and a traveling driver 5. The overhead transport vehicle 3 travels along a traveling rail (track) 6 by the driving force of the travel driver 5. The traveling rail 6 is arranged in the vicinity of a ceiling 18 in a state of being suspended from the ceiling 18 of, for example, a clean room by metal hangers or the like, and extends in the X direction. The traveling rail 6 is not limited to being suspended by metal hangers or the like, and may be directly attached to the ceiling 18.

The traveling driver 5 has a linear motor or an electric rotary motor (not shown in the figure) as a drive source, traveling wheels 7, and an encoder (not shown in the figure). The traveling wheels 7 are arranged in a state of being capable of traveling on a part of the traveling rail 6. The encoder, for example, detects a rotation speed of the traveling wheels 7 or an indicator formed on the traveling rail 6, and outputs the detection result to a controller (not shown in the figure). The controller controls the linear motor or the like on the basis of the detection result of the encoder and controls the speed or the stop position of the overhead transport vehicle 3.

On the overhead transport vehicle 3, a support shaft 9 extending downward from the travel driver 5 is attached. On a lower portion of the support shaft 9, a base 10 is attached. On a lower portion of the base 10, a lateral extender 11 is attached. The lateral extender 11 has a plurality of movable plates 11a arranged as being stacked in the vertical direction (Z direction), and on a lower portion of the lowermost movable plate 11a, a lift driver 12 is attached. The overhead transport vehicle 3 can move the lift driver 12 in the horizontal direction by the lateral extender 11.

The base 10 has a Y direction guide (not shown in the figure), a Y direction driver (not shown in the figure), and so forth. The base 10 can move the lateral extender 11 along the guide in the +Y direction or in the −Y direction by a driving force from the Y direction driver such as an electric motor. The lateral extender 11 has a plurality of movable plates 11a arranged to be stacked, for example, in the Z direction. Three of the movable plates 11a are used in this example, but this is not limiting and two, or four or more movable plates 11a may be used. Each of the plurality of movable plates 11a is movable in the Y direction, being guided by the Y direction guide. On the lowermost (−Z side) movable plate 11a there are provided the lift driver 12 and a rotator not shown in the figure.

The rotator has a rotation member (not shown in the figure) and a rotation driver (not shown in the figure). The rotation member is provided to be rotatable about an axis in the vertical direction (Z axis). The rotation member is connected to the lift driver 12, and can rotate the lift driver 12 about the axis in the vertical direction. An electric motor or the like is used as the rotation driver, and the rotation driver rotates the rotation member about the axis in the vertical direction. The rotator rotates the lift driver 12 by the driving force from the rotation driver, whereby it is possible to change the orientation of the article holder 13 (or the article 2) described later. Such a rotator is controlled by a controller not shown in the figure. However, whether or not the overhead transport vehicle 3 includes the rotator is optional, and the rotator need not be provided.

The article holder 13 grasps the flange 22 of the article 2 to thereby suspend and hold the article 2. The article holder 13 is, for example, a chuck having claws 13a movable in the horizontal direction, and inserts the claws 13a under the flange 22 of the article 2 and lifts the article holder 13, to thereby suspend and hold the article 2. The article holder 13 is connected to a plurality of (for example, four) suspenders 13b such as wires and belts. The lift driver 12 is, for example, a hoist, and can lower the article holder 13 by feeding out the suspenders 13b and can lift the article holder 13 by taking up the suspenders 13b. The lift driver 12 is controlled by a controller to lift or lower the article holder 13 at a predetermined speed. Also, the lift driver 12 is controlled by the controller to maintain the article holder 13 at a target height.

The base 10, the lateral extender 11 and the lift driver 12 move in the X direction integrally with the traveling driver 5. On the −X side and the +X side of the base 10, the lateral extender 11, and the lift driver 12, covers 16 are provided, respectively (see FIG. 2). Each cover 16 is supported on the overhead transport vehicle 3 via the support shaft 9, and moves together with the overhead transport vehicle 3 in the X direction. The covers 16 are arranged in a state of extending downward from the lower end of the article 2 to cover, in the vertical direction, the article 2 held by the article holder 13 when the article 2 is transported.

The first placement parts 21 are arranged below (on the −Z side) the traveling rail 6 and on both sides on the +Y side and the −Y side of the traveling rail 6. The first placement parts 21 are a first side track buffer arranged on the side of the traveling rail 6. The first placement parts 21 are provided on a first frame 31. The first frame 31 is formed in a belt-like plate shape, but the shape of the first frame 31 is not limited thereto. The first frame 31 extends in the X direction along the traveling rail 6. Moreover, the first frame 31 is fixed to be suspended from the ceiling 18 by vertically rod-shaped fixtures 34, and is arranged in the vicinity of the ceiling 18.

The first frame 31 is arranged lower (on the −Z side), by more than the total height of two of the articles 2 (distance in the Z direction), than a reference, which is the article holder 13 having been lifted to the highest position by the lift driver 12 of the overhead transport vehicle 3. Accordingly, the first placement parts 21 are arranged lower, by more than the total height of two of the articles 2, than a reference, which is the article holder 13. As shown in FIG. 2, a plurality of the first placement parts 21 are arranged in line in the X direction on the first frame 31. The number of the first placement parts 21 arranged in the X direction can be optionally set and is set according to the length of the first frame 31 in the X direction.

Each first placement part 21 is arranged in a position where the article 2 held by the article holder 13 can be placed thereon in the state where the article holder 13 and the lift driver 12 have been projected in the Y direction by a first projection length R1 by the lateral extender 11. The first placement part 21 is arranged so that the plurality of pins 25 of the first placement part 21 are positioned below the recesses 2e of the article 2, in the state where the article holder 13 and the lift driver 12 have been projected in the Y direction by the first projection length R1 by the lateral extender 11. In other words, the first placement part 21 is arranged directly below the article 2 held by the article holder 13, in the state where the article holder 13 and the lift driver 12 have been projected in the Y direction by the first projection length R1 by the lateral extender 21. Moreover, for example, there is a clearance in the vertical direction between the article 2 held by the article holder 13 having been lifted to the highest position and the first placement part 21.

The first placement part 21 is set to a height at which the article holder 13 and the lift driver 12 can be projected by a second projection length R2, which is longer than the first projection length R1, by the lateral extender 11 while the article 2 is held by the article holder 13, in a state where the article 2 is placed thereon. As described above, the first placement part 21 is arranged lower, by more than the total height of two of the articles 2, than the article holder 13 having been projected toward the side of the traveling rail 6 by the first projection length R1 by the lateral extender 11 and having been lifted to the highest position by the lift driver 12. As a result, even when the article holder 13 holding the article 2 and the lift driver 12 are projected by the second projection length R2 by the lateral extender 11, collision can be avoided between the article 2 placed on the first placement part 21 and the article 2 held by the article holder 13.

The second placement parts 22 are arranged below (on the −Z side) the traveling rail 6, on both sides on the +Y side and the −Y side of the traveling rail 6, and on the outer side of the first placement parts 21. That is to say, the second placement parts 22 are arranged further on the +Y side of the first placement parts 21 on the +Y side and are arranged further on the −Y side of the first placement parts 21 on the −Y side. In a manner similar to that of the first placement parts 21, the second placement parts 22 are a second side track buffer arranged on the side of the traveling rail 6.

Each second placement part 22 is arranged in a position where the article 2 held by the article holder 13 can be placed thereon in the state where the article holder 13 and the lift driver 12 have been projected in the Y direction by a second projection length R2 by the lateral extender 11. The second placement part 22 is arranged so that the plurality of pins 25 of the second placement part 22 are positioned below the recesses 2e of the article 2, in the state where the article holder 13 and the lift driver 12 have been projected in the Y direction by the second projection length R2 by the lateral extender 11. In other words, the second placement part 22 is arranged directly below the article 2 held by the article holder 13, in the state where the article holder 13 and the lift driver 12 have been projected in the Y direction by the second projection length R2 by the lateral extender 21. Moreover, for example, there is a clearance in the vertical direction between the article 2 held by the article holder 13 having been lifted to the highest position and the second placement part 22. Furthermore, the second placement parts 22 are arranged above (on the +Z side) the first placement parts 21 only by a distance L1.

The second placement parts 22 are provided on a second frame 32. The second frame 32 is formed in a belt-like plate shape, but the shape of the second frame 32 is not limited thereto. As with the first frame 31, the second frame 31 is fixed in a state of being suspended from the ceiling 18 by vertically rod-shaped fixtures 34, and is arranged in the vicinity of the ceiling 18. The second frame 32 extends in the X direction along the traveling rail 6. Although the second placement parts 22 are integrated with the first placement parts 21 by the fixtures 34, the second placement parts 22 are not limited thereto, and the second frame 32 may be suspended from the ceiling 18 by fixtures different from those of the first frame 31.

As shown in FIG. 2, a plurality of the second placement parts 22 are arranged in line in the X direction on the second frame 32. The second placement parts are arranged at the same positions as those of the first placement parts in the X direction along the traveling rail 6. That is to say, the first placement parts 21 and the second placement parts 22 are arranged side by side in the Y direction orthogonal to the X direction. In this configuration, the first placement parts 21 and the second placement parts 22 are not arranged out of alignment with the direction along the traveling rail 6 and, as a result, at a single position where the overhead transport vehicle 3 stops, the article 2 can be transferred to either the first placement part 21 or the second placement part 22. That is to say, the stop position of the overhead transport vehicle 3 at the time of transferring the article 2 to the first placement part 21 can be the same as the stop position of the overhead transport vehicle 3 at the time of transferring the article 2 to the second placement part 22. However, the first placement part 21 and the second placement part 22 are not limited to being arranged at the same positions in the X direction along the traveling rail 6, and the first placement part 21 and the second placement part 22 may be arranged to be displaced in the X direction.

The third placement parts 23 are arranged below (on the −Z side) the traveling rail 6. The third placement parts 23 are an under track buffer arranged directly below the traveling rail 6, and are arranged in the vicinity of the ceiling 18. Each third placement part 23 is arranged in a position where the article 2 held by the article holder 13 can be placed thereon when the article holder 13 is lowered. The third placement parts 23 may be formed to be held by the fixtures 34 of the first frame 31 forming the first placement parts 21 or may be suspended from the ceiling 18 by fixtures different from the fixtures 34. Also, although not shown in the figure, a plurality of the third placement parts 23 may be arranged in the X direction directly below the traveling rail 6. However, as described above, the third placement parts 23 need not be provided.

The plurality of pins 25 that position the article 2 are provided on each first placement part 21, each second placement part 22, and each third placement part 23. Three pins 25 are provided facing upward, for example. The respective pins 25 are arranged to correspond to the positions of the plurality of radially patterned recesses 2e provided on the bottom portion of the article 2, and can fit into the respective recesses 2e. When the article 2 is placed on the first placement part 21, the second placement part 22, or the third placement part 23, the pins 25 fit into the recesses 2e of the article 2, thereby positioning the article 2. The shapes and the numbers of the recesses 2e and the pins 25 are not limited to the configuration shown in FIGS. 1 and 2 and can optionally be set.

Figure 3:
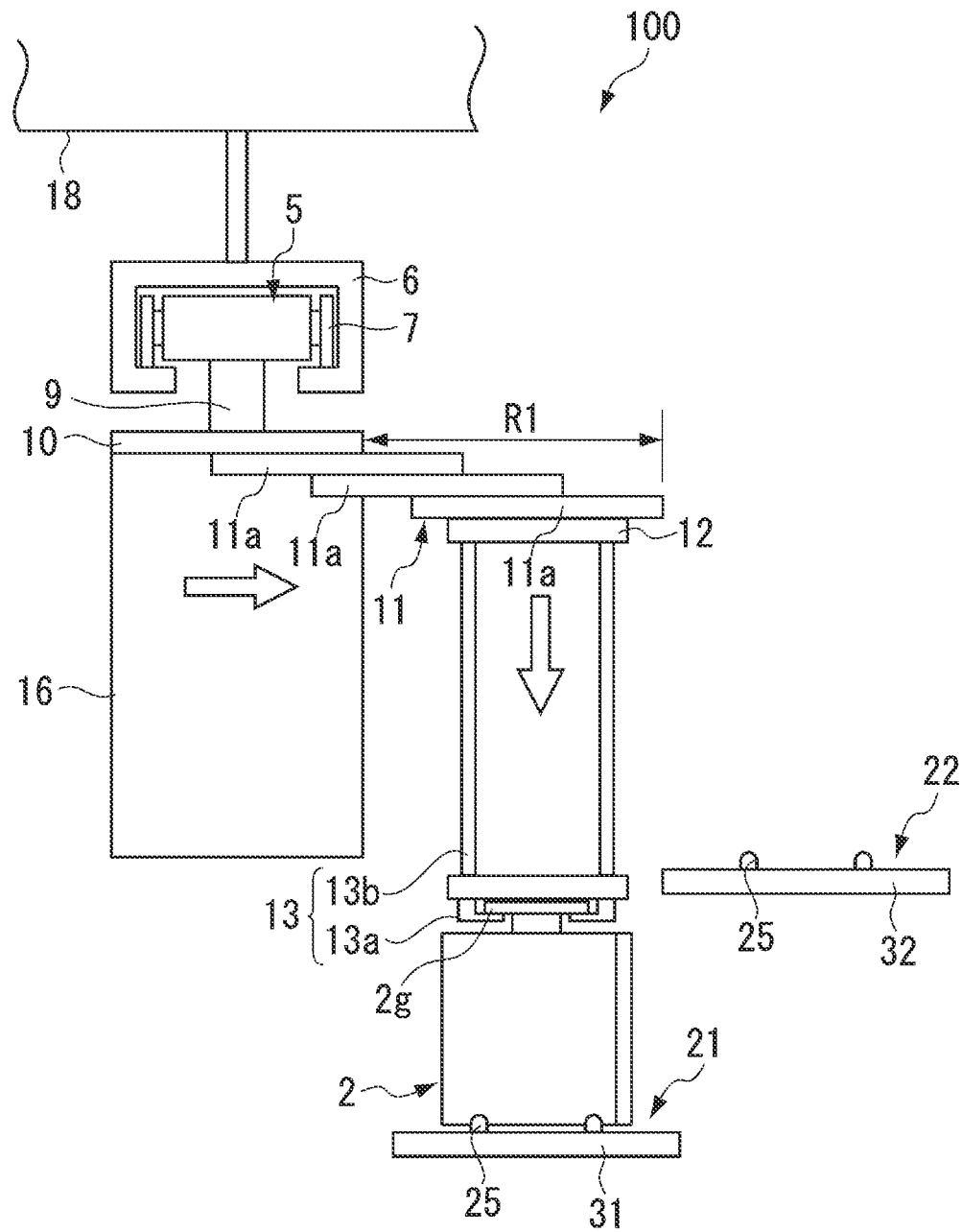
FIG. 3 is a diagram describing an operation of placing a container on a first placement part.

Next, operation of the overhead transport system 100 will be described. FIG. 3 is a diagram describing an operation of placing the article 2 on the first placement part 21. When placing the article 2 on the first placement part 21, the controller that controls the overhead transport vehicle 3 causes the overhead transport vehicle 3 holding the article 2 to stop at the side of the first placement part 21 and causes the lateral extender 11 to project, for example, in the +Y direction by the first projection length R1. Subsequently, the controller drives the lift driver 12 to lower the article holder 13, and thereby the article 2 is lowered and placed on the first placement part 21 as shown in FIG. 3. At this time, the pins 25 enter the recesses 2e of the article 2 to position the article 2 with respect to the first placement part 21.

Figure 4A:
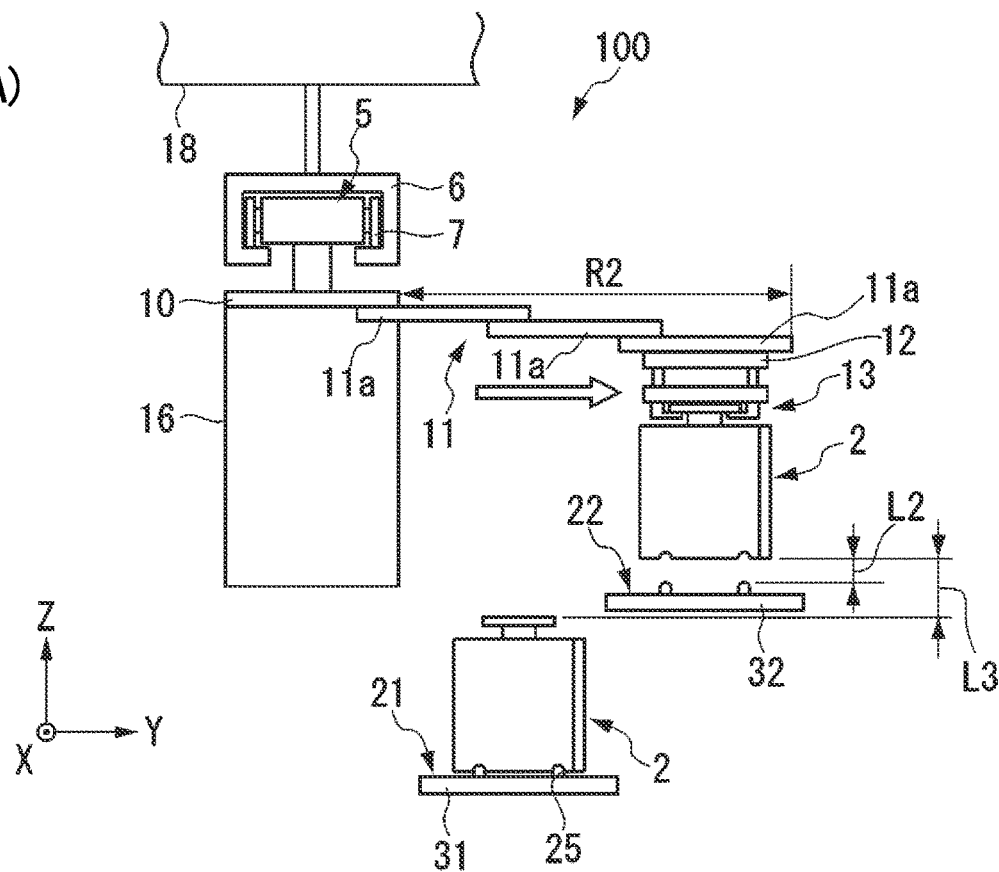
FIGS. 4(A) and 4(B) show an operation of placing a container on a second placement part, FIG. 4(A) showing a state of a lateral extender having been projected by a second projection length, and FIG. 4(B) showing a state of the container having been moved downward.
Figure 4B:
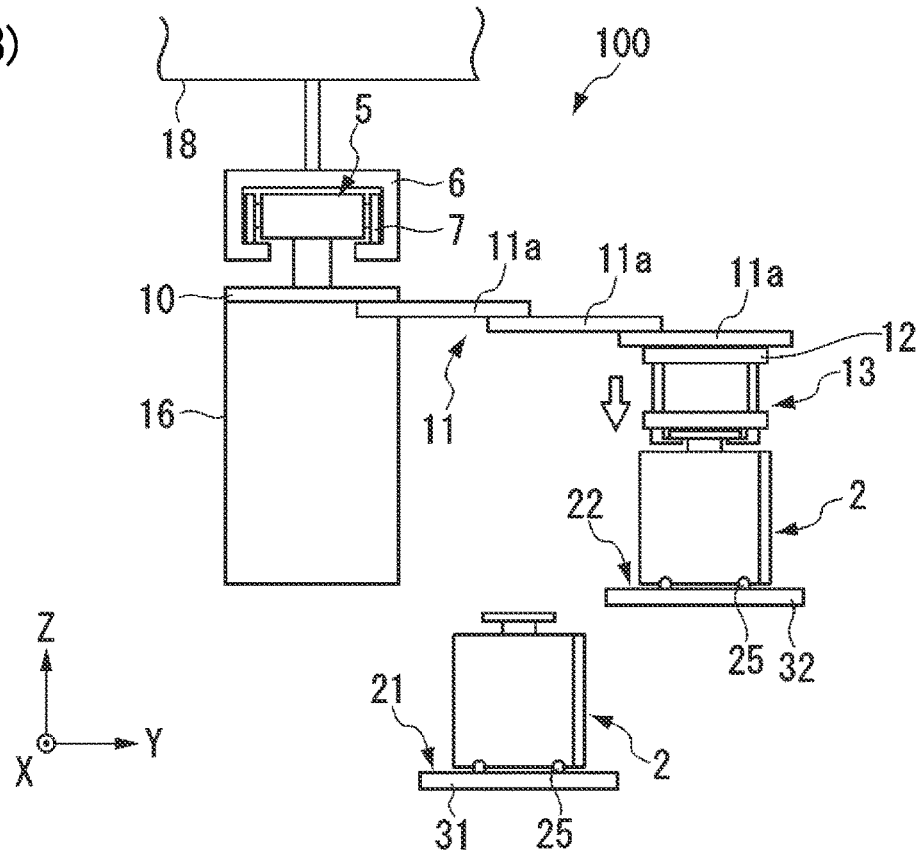

Next, an operation of placing the article 2 on the first placement part 22 from this state will be described. FIGS. 4(A) and 4(B) are diagrams describing the operation of placing the article 2 on the second placement part 22, FIG. 4(A) showing a state of the lateral extender 11 having been projected by a second projection length R2, and FIG. 4(B) showing a state of the article 2 having been moved downward by the lift driver 12. First, the controller causes the overhead transport vehicle 3 holding the article 2 to stop at the side of the first placement part 22 of the transfer destination. Subsequently, as shown in FIG. 4(A), the controller causes the lateral extender 11 to project by the second projection length R2 in the +Y direction, for example.

At this time, the lower end of the article 2 held by the article holder 13 is in a state of having a distance L3 from the upper end of the article 2 placed on the first placement part 21. Accordingly, the lateral extender 11 can project the article holder 13 and the lift driver 12 by the second projection length R2 without interfering with the article 2 placed on the first placement part 21.

Also, the second placement part 22 is arranged above the first placement part 21 only by the distance L1. While the second placement part 22 is arranged above the first placement part 21, a distance L2 is ensured between the lower end of the article 2 and the second placement part 22 when the lateral extender 11 has projected by the second projection length R2. Therefore, even when the lateral extender 11 has projected the article holder 13 and the lift driver 12 by the second projection length R2, the lower end of the article 2 does not collide with the second placement part 22. In FIGS. 4(A) and 4(B), the distance between the upper end of the pin 25 and the lower end of the article 2 is shown as the distance L2. By reducing the distance L2, it is possible to reduce the length of lifting or lowering the article 2 performed by the lift driver 12, and it is possible to reduce the length of time required to lift or lower the article 2, thereby improving the transfer efficiency of the articles 2.

The second placement part 22 is arranged above the upper end of the article 2 placed on the first placement part 21, but this description is not limited thereto. For example, the second placement part 22 may be arranged at the same height as the upper end of the article 2 placed on the first placement part 21, or may be arranged below the upper end of the article 2 placed on the first placement part 21.

Next, the controller drives the lift driver 12 to lower the article 2 and, thereby, the article 2 can be placed on the second placement part 22 as shown in FIG. 4(B). At this time, the pins 25 enter the recesses 2e of the article 2 to position the article 2 with respect to the second placement part 22. When placing the article 2 on the third placement part 23, the overhead transport vehicle 3 is stopped above the third placement part 23 of the transfer destination. Subsequently, the lift driver 12 is driven to lower the article 2 and, thereby, the article 2 can be placed on the third placement part 23. When placing the article 2 on the third placement part 23, the pins 25 enter the recesses 2e of the article 2 to position the article 2 with respect to the third placement part 23 as described above.

Moreover, when transferring the article 2 placed on the first placement part 21 or the second placement part 22 to the overhead transport vehicle 3, the lateral extender 11 projects the article holder 13 by the first projection length R1 or by the second projection length R2 as described above. Then, the lift driver 12 is driven to lower the article holder 13, and after having grasped the flange 2g of the article 2 with the claws 13a, the lift driver 12 is driven to lift the article holder 13. Subsequently, by driving the lateral extender 11 to retract the movable plate 11a, the article 2 is accommodated within the covers 16 of the overhead transport vehicle 3.

When transferring the article 2 placed on the second placement part 22 to the overhead transport vehicle 3, even when the article 2 is placed on the first placement part 21, the distance L3 is ensured between the lower end of the article 2 in the state of the article holder 13 having been lifted and the upper end of the article 2 placed on the first placement part 21. Therefore, when accommodating the article 2 within the covers 16 of the overhead transport vehicle 3, the article 2 does not collide with the upper end of the article 2 placed on the first placement part 21.

As described above, according to the overhead transport system 100 of the first example, the articles 2 can be transferred to and from both the first placement parts 21 and the second placement parts 22 by the lateral extender 11. As a result, the number of the placement parts on which the articles 2 can be placed can be increased toward the side of the traveling rail 6, and the number of articles 2 that can be stored in the vicinity of the ceiling 18 can be increased. Furthermore, the lateral extender 11 can transfer the article 2 to the second placement part 22 without interfering with the article 2 placed on the first placement part 21. As a result, it is possible to transfer the article 2 to the second placement part 22, which is distanced from the overhead transport vehicle 3, regardless of whether or not another article 2 is placed on the first placement part 21.

In the example described above, the first placement parts 21 and the second placement parts 22 are provided on both the +Y side and the −Y side of the traveling rail 6 (or the overhead transport vehicle 3) being the center thereof, however, this description is not limited thereto. For example, the first placement parts 21 and the second placement parts 22 may be arranged only on either one of the +Y side and the −Y side while not having the first placement parts 21 and the second placement parts 22 arranged on the other side, or only one of the first placement parts 21 and the second placement parts 22 may be arranged on the other one of the +Y side or the −Y side.

Second Example

Figure 5:
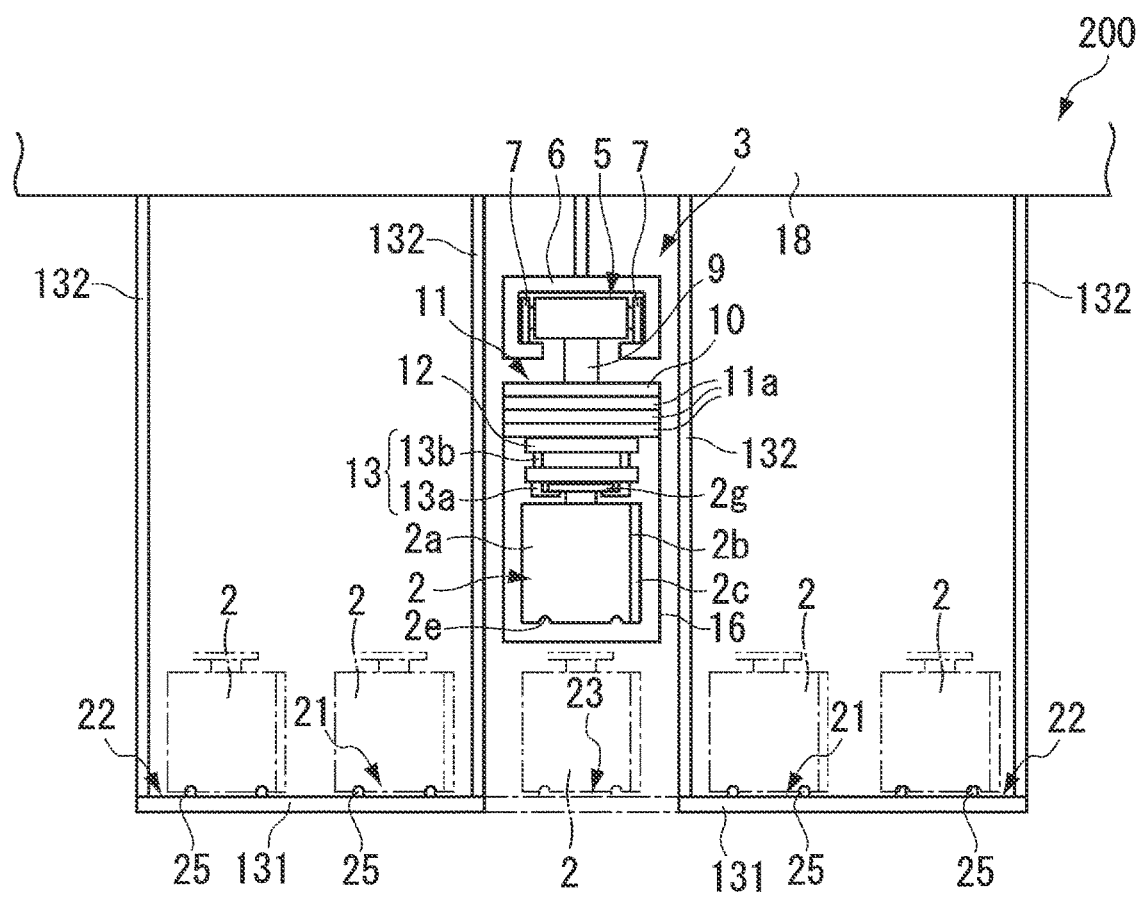
FIG. 5 is a front elevation view showing an example of an overhead transport system according to a second example.

FIG. 5 is a diagram showing a second example of an overhead transport system 200. The second example differs from the first example in that the height position (the position in the Z direction) is the same between the first placement parts 21 and the second placement parts 22. The other configurations that are the same as those of the first example are assigned with the same symbols and the descriptions thereof are omitted or simplified. Hereinafter, differences from the first example will mostly be described.

As with the first example, the first placement part 21 is arranged in a position where the article 2 held by the article holder 13 can be placed thereon in the state where the article holder 13 and the lift driver 12 have been projected in the Y direction by the first projection length R1 by the lateral extender 11. That is to say, the first placement part 21 is arranged so that the pins 25 are positioned below the recesses 2e of the article 2 when the length of projection of the lateral extender 11 is the first projection length R1. The second placement part 22 is arranged in a position where the article 2 held by the article holder 13 can be placed thereon in the state where the article holder 13 and the lift driver 12 have been projected in the Y direction by the second projection length R2 by the lateral extender 11. That is to say, the second placement part 22 is arranged so that the pins 25 are positioned below the recesses 2e of the article 2 when the length of projection of the lateral extender 11 is the second projection length R2.

The first placement parts 21 and the second placement parts 22 are provided on the same frame 131 in a state of being aligned in the Y direction. The frame 131 is formed in a belt-like plate shape. The frame 131 is fixed in a state of being suspended from the ceiling 18 by vertically rod-shaped fixtures 132, and is arranged in the vicinity of the ceiling 18. The frame 132 extends in the X direction along the traveling rail 6. The first placement parts 21 and the second placement parts 22 are not limited to being provided on the same frame 131. For example, the first placement parts 21 and the second placement parts 22 may be provided on different frames, and the frames may be suspended from the ceiling 18 by common or different fixtures.

Figure 6:
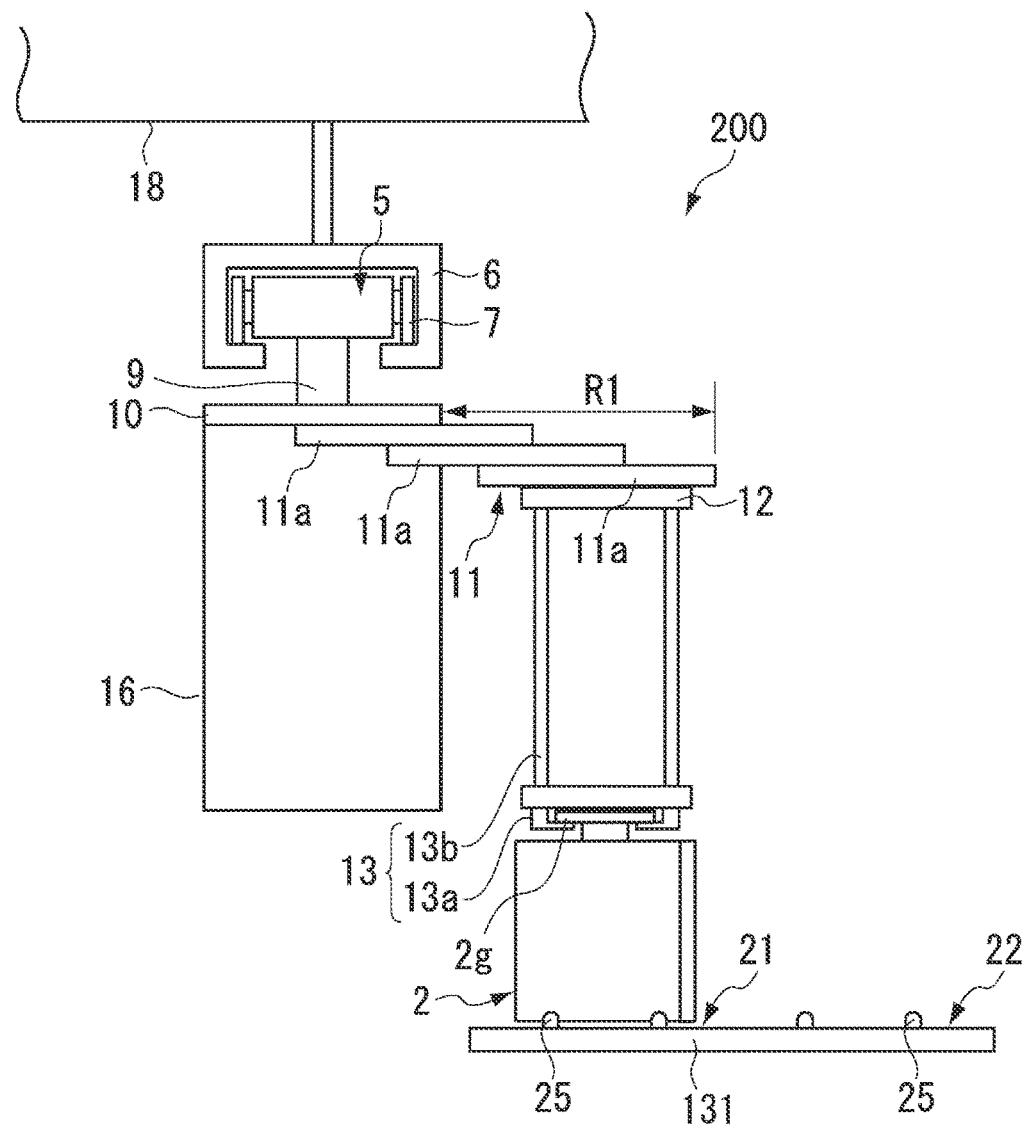
FIG. 6 is a diagram describing an operation of placing a container on the first placement part.
Figure 6:
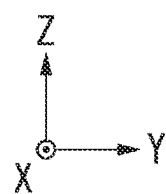

Next, operations of the overhead transport system 200 will be described. FIG. 6 is a diagram describing an operation of placing the article 2 on the first placement part 21. As with the first example, when placing the article 2 on the first placement part 21, the controller that controls the overhead transport vehicle 3 causes the overhead transport vehicle 3 to stop at the side of the first placement part 21 of the transfer destination of the article 2. Subsequently, the controller causes the lateral extender 11 to project by the first projection length R1 in the +Y direction, for example. Then, the controller causes the lift driver 12 to lower the article holder 13, and thereby the article 2 is lowered. As a result, the article 2 is placed on the first placement part 21 as shown in FIG. 6.

Figure 7A:
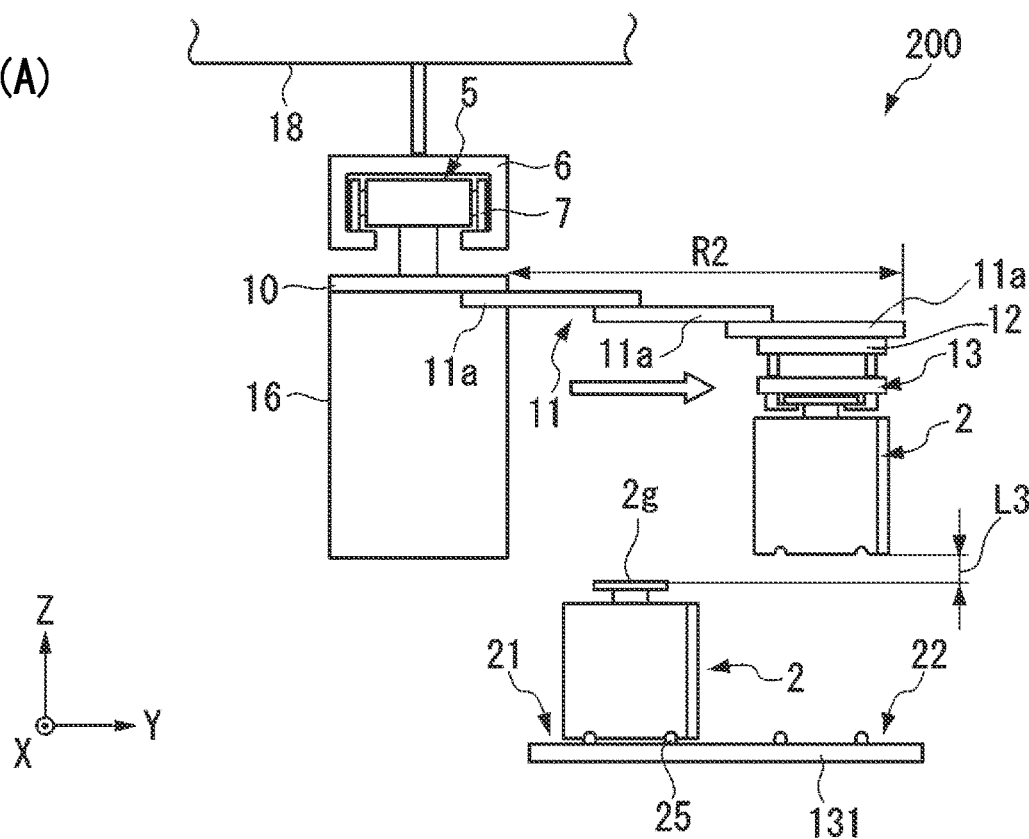
FIGS. 7(A) and 7(B) show an operation of placing a container on a second placement part, FIG. 7(A) showing a state of a lateral extender having been projected by a second projection length, and FIG. 7(B) showing a state of the container having been moved downward.
Figure 7B:
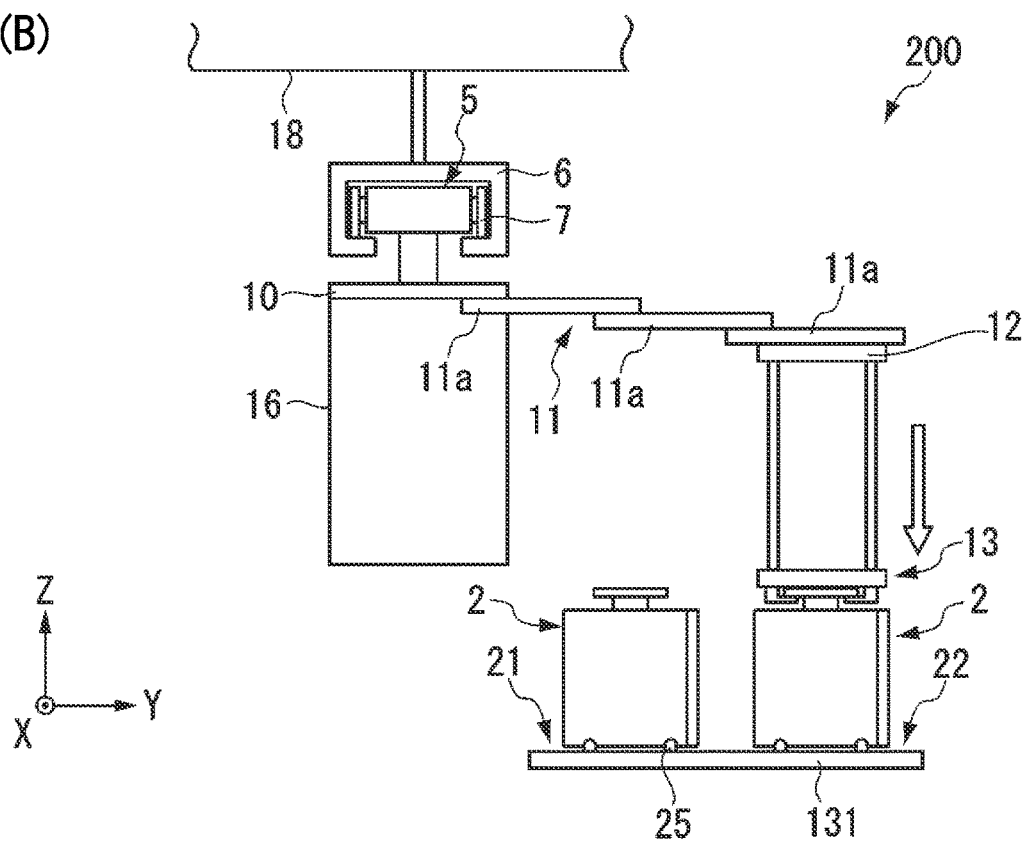

Next, an operation of placing the article 2 on the second placement part 22 will be described. FIGS. 7(A) and 7(B) are diagrams describing an operation of placing the article 2 on the second placement part 22, FIG. 7(A) showing a state of the lateral extender 11 having been projected by the second projection length R2, and FIG. 7(B) showing a state of the article 2 having been lowered by the lift driver 12. First, the controller causes the overhead transport vehicle 3 to stop at the side of the second placement part 22 of the transfer destination of the article 2. Subsequently, as shown in FIG. 7(A), the controller causes the lateral extender 11 to project by the second projection length R2 in the +Y direction, for example.

At this time, a distance L3 is ensured between the lower end of the article 2 held by the article holder 13 and the upper end of the article 2 placed on the first placement part 21. Accordingly, the article holder 13 holding the article 2 and the lift driver 12 can be projected by the second projection length R2 without interfering with the article 2 placed on the first placement part 21. Then, the controller drives the lift driver 12 to lower the article holder 13. As a result, the article 2 is placed on the second placement part 22 as shown in FIG. 7(B).

As described above, according to the overhead transport system 200 of the second example, even when the heights of the first placement part 21 and the second placement part 22 are the same, as with the first example, the article 2 can be transferred to the second placement part 22, which is distanced from the overhead transport vehicle 3, regardless of whether or not another article 2 is placed on the first placement part 21, and it is possible to increase the number of the articles 2 that can be stored in the vicinity of the ceiling 18. Since the first placement part 21 and the second placement part 22 are arranged at the same height, the overall structure is simple and installation cost can be reduced. Also, since the stroke of lifting and lowering performed by the lift driver 12 is the common between the first placement part 21 and the second placement part 22, the control performed by the controller can be simplified.

As with the first example, in the overhead transport system 200, third placement parts 23 may be arranged below the traveling rail 6. The third placement part 23 has the same configuration as that in the first example, and the description thereof is omitted. The third placement parts 23 may be held by the fixtures 132 or may be suspended from the ceiling 18 by fixtures different from the fixtures 132.

The examples have been described above. However, this disclosure is not limited to the above description, and various modifications may be made without departing from the scope of the appended claims. For example, the examples have been described in which the first placement parts 21 and the third placement parts 23 are arranged at the same height positions (the positions in the Z direction), but the description is not limited thereto.

Figure 8:
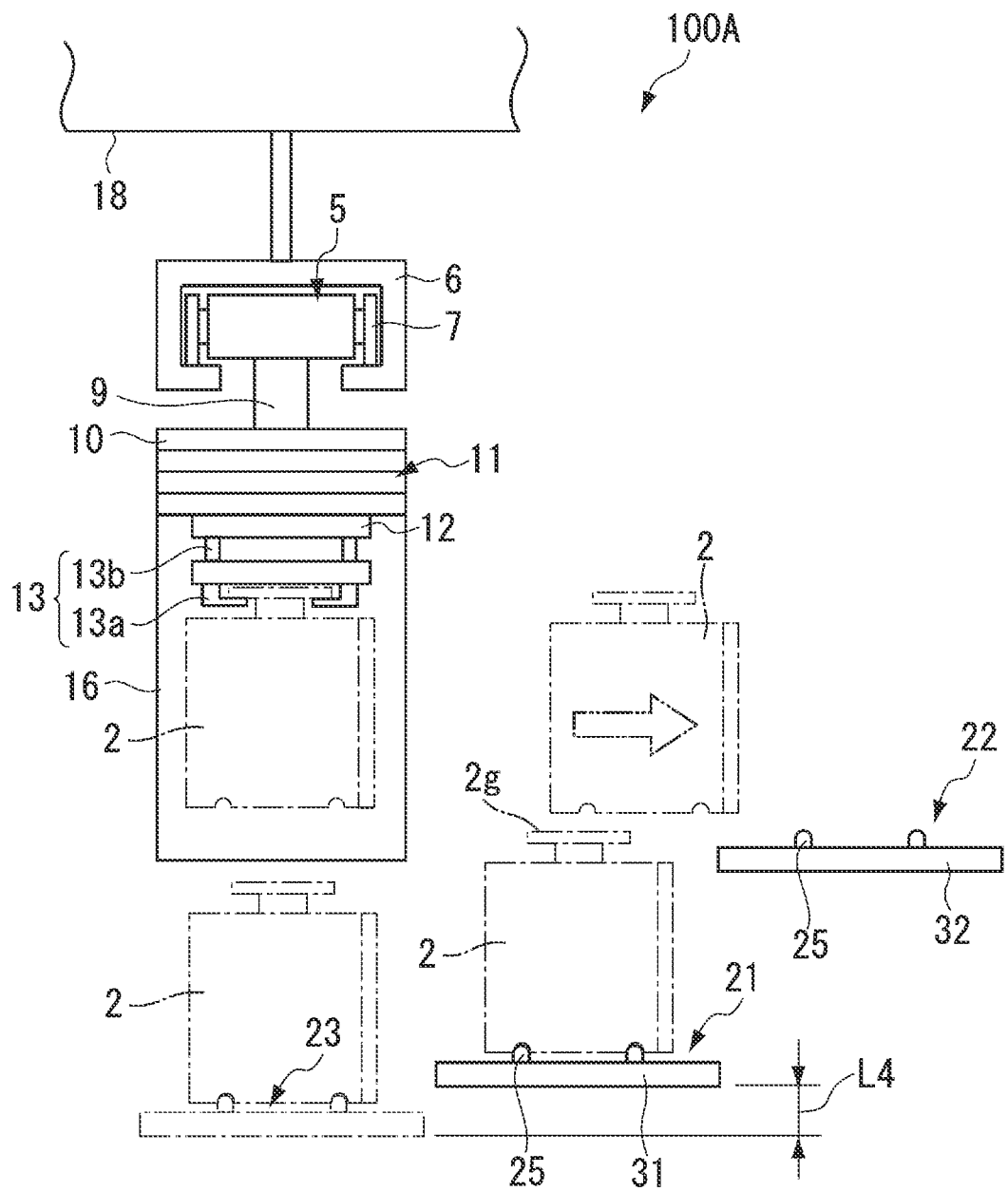
FIG. 8 is a front elevation view showing an overhead transport system according to a modified example.

FIG. 8 is a front elevation view showing an example of an overhead transport system 100A according to a modified example. As in the overhead transport system 100A shown in FIG. 8, the first placement part 21 may be arranged above the third placement part 23. As shown in FIG. 8, the overhead transport vehicle 3 includes a cover 16 that covers the article 2 being transported. This cover 16 extends downward from the lower end of the article 2 being transported. The third placement part 23 is set to a height at which the upper end of the placed article 2 does not interfere with the cover 16. On the other hand, since it is sufficient to ensure the distance L3 described above from the upper end of the placed article 2, the first placement part 21 need not to have the same height as that of the third placement part 23, and can be arranged above the third placement part 23.

In this way, the third placement part 23 is arranged below the first placement part 21, that is to say, the first placement part 21 is arranged above the third placement part 23, and thereby, the distance by which the lift driver 12 lifts or lowers the article 2 is reduced. As a result, the length of time required to lift or lower the article 2 is reduced, and the transfer efficiency of the articles 2 can be improved. The first placement part 21 can be arranged up to a height at which the distance L3 (see FIGS. 4(A) and 4(B) or 7(A) and 7(B)) can be ensured.

Figure 9:
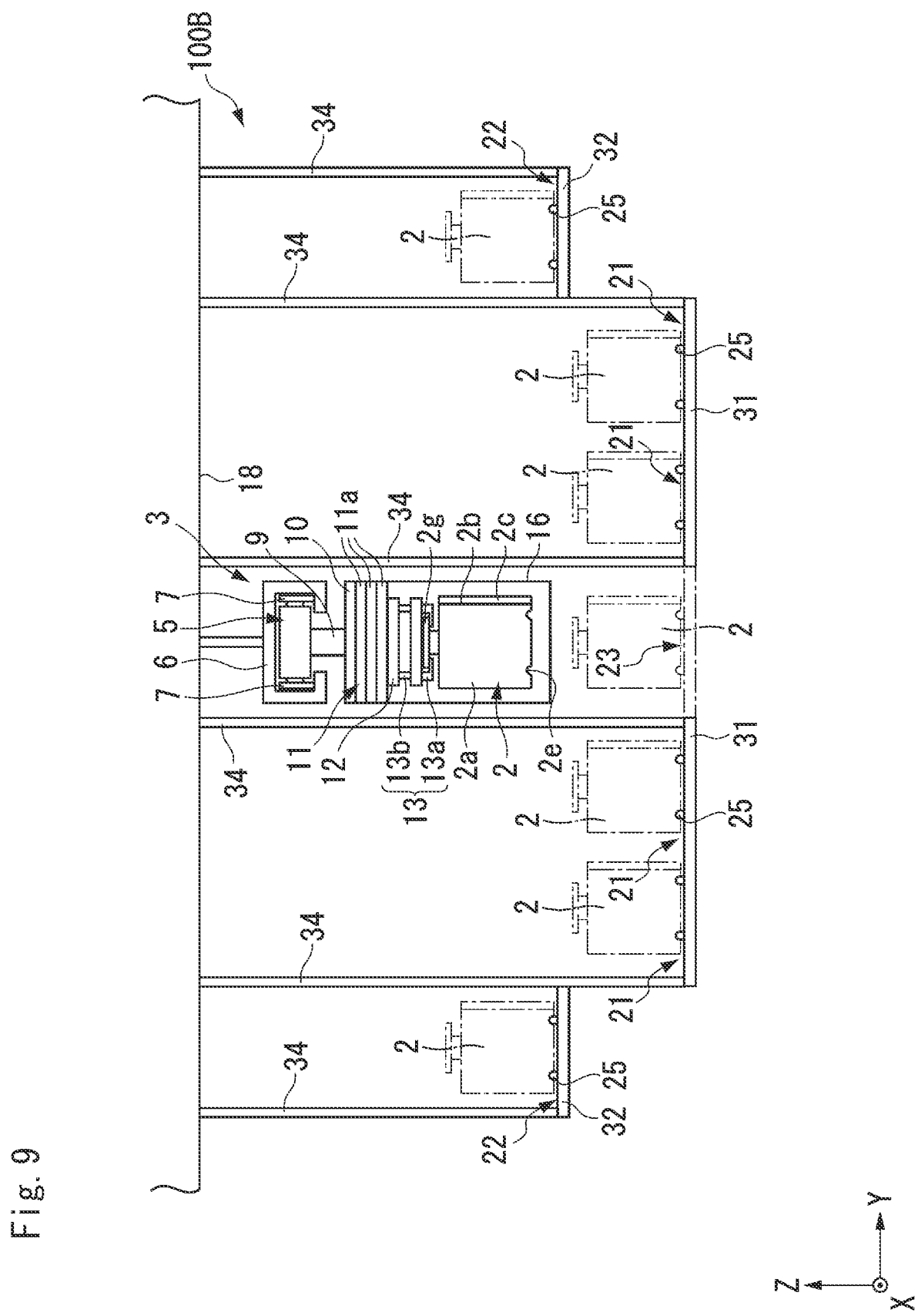
FIG. 9 is a front elevation view showing an overhead transport system according to another modified example.

The above examples have been described in which the first placement parts 21 are arranged in a single line on each of the +Y side and the −Y side of the traveling rail 6, but this description is not limited thereto. FIG. 9 is a front elevation view showing an example of an overhead transport system 100B according to another modified example. As in the overhead transport system 100B shown in FIG. 9, the first placement parts 21 may be arranged in two lines on each of the +Y side and the −Y side of the traveling rail 6. As a result, it is possible to further increase the number of articles 2 that can be stored in the vicinity of the ceiling 18. The first placement parts 21 may be arranged in three or more lines, and the number of the lines of the first placement parts 21 may be different between the +Y side and the −Y side of the traveling rail 6.

Figure 10:
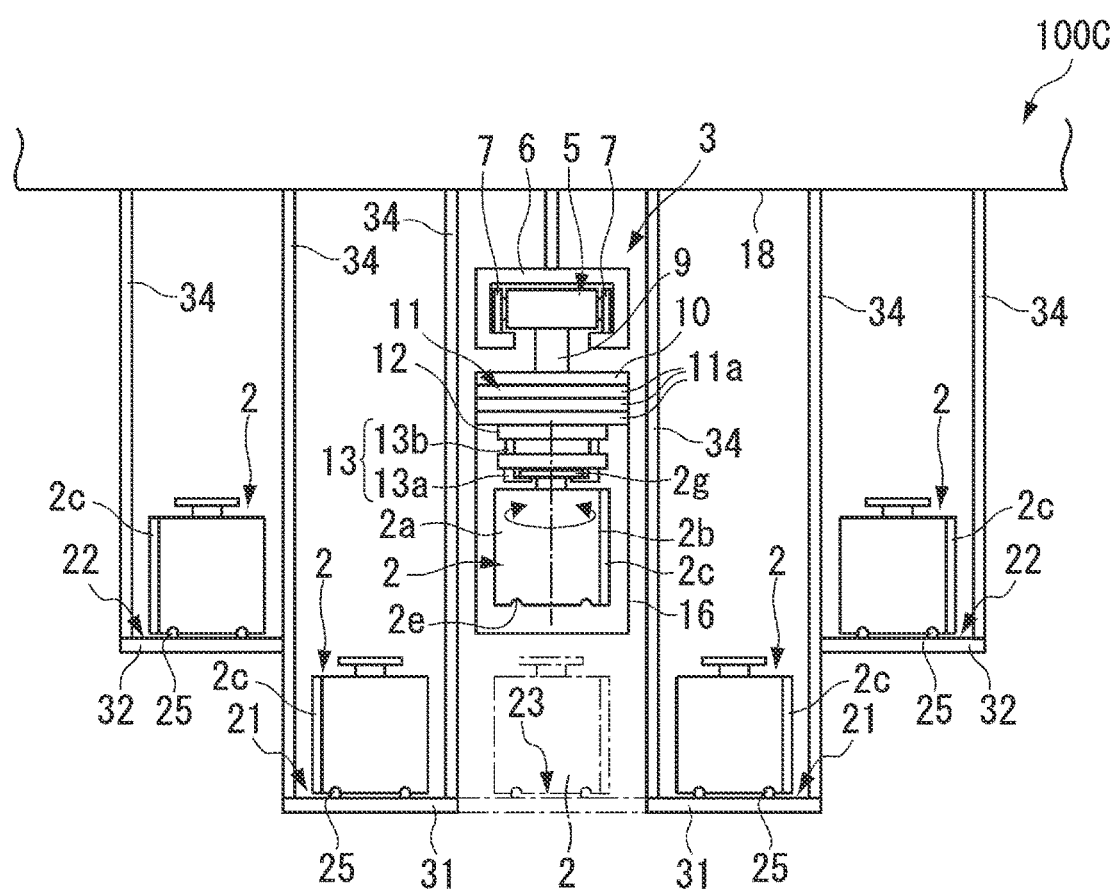
FIG. 10 is a front elevation view showing an overhead transport system according to still another modified example.

The above examples have been described in which the article 2 is arranged so that the lid 2c is positioned on the +Y side, but this description is not limited thereto. FIG. 10 is a front elevation view showing an example of an overhead transport system 100C according to still another modified example. In the overhead transport system 100C shown in FIG. 10, as for the +Y side of the traveling rail 6, each of the articles 2 placed on the first placement part 21 and the second placement part 22 is arranged so that the lid 2c is positioned on the +Y side, as with the first example. As for the −Y side of the traveling rail 6, each of the articles 2 placed on the first placement part 21 and the second placement part 22 is arranged so that the lid 2c is positioned on the −Y side. When placing the articles 2 on the first placement part 21 and the second placement part 22 on the −Y side of the traveling rail 6, the overhead transport system 100C realizes this by turning the article 2, with the rotator, in a direction about the Z axis.

The above examples have been described in which the first placement parts 21 are arranged lower, by more than the total height of two of the articles 2, than a reference, which is the article holder 13. However, this description is not limited thereto, and the first placement parts 21 may be arranged higher, by more than the total height of two of the articles 2, than a reference, which is the article holder 13.

Furthermore, in the above examples, the configurations have been shown in which the article 2 is simply placed on the first placement part 21, the second placement part 22, or the third placement part 23, but processing may also be performed on the article 2 when the article 2 is placed. For example, at least one of the first placement part 21, the second placement part 22, and the third placement part 22 may include a purge gas supplier that supplies a purge gas to the interior of the article 2 when the article 2 is placed. This purge gas supplier includes, for example, a supply nozzle connected to the interior of the article 2, and a purge gas may be supplied through this supply nozzle when the article 2 is placed on the first placement part 21 or the like.

In addition, the contents of Japanese Patent Application No. 2016-186750 and all documents cited in the detailed description are incorporated herein by reference to the extent permitted by law.

The invention claimed is:

1. An overhead transport system comprising:
   a track installed on a ceiling or in a vicinity of the ceiling;
   an overhead transport vehicle that travels along the track and includes an article holder that holds an article, a lift driver that lifts or lowers the article holder, and a lateral extender capable of projecting the article holder and the lift driver toward a side of the track;
   a first placement part arranged below and on the side of the track, that can have placed thereon an article held by the article holder in a state where the article holder and the lift driver have been projected by a first projection length by the lateral extender, and is set to a height at which the article holder and the lift driver can be projected by a second projection length, which is longer than the first projection length, by the lateral extender while the article is held by the article holder, in a state where the article is placed thereon, and also articles do not interfere with each other when the article holder and the lift driver are projected;
   a second placement part arranged below and on the side of the track and on an outer side of the first placement part, and can have placed thereon the article held by the article holder in a state where the article holder and the lift driver have been projected by the second projection length by the lateral extender; and
   a third placement part arranged directly below the track and can have placed thereon an article held by the article holder, wherein
   a distance from the track in a horizontal direction to the second placement part is larger than a distance from the track in a horizontal direction to the first placement part,
   the first placement part and the third placement part are arranged at the same height,
   the second placement part is arranged above the first placement part, and
   at a single position where the overhead transport vehicle stops, the article can be transferred to any of the first, the second, and the third placement parts.

2. The overhead transport system according to claim 1, wherein the first placement part is arranged lower, by more than a total height of two of the articles, than a reference, which is the article holder in a state of being projected toward the side of the track by the first projection length.

3. The overhead transport system according to claim 2, wherein a plurality of the first placement parts are arranged toward the side of the track.

4. The overhead transport system according to claim 2, wherein the first placement part and the second placement part are each provided on a frame suspended from the ceiling.

5. The overhead transport system according to claim 1, wherein a plurality of the first placement parts are arranged toward the side of the track.

6. The overhead transport system according to claim 5, wherein the first placement part and the second placement part are each provided on a frame suspended from the ceiling.

7. The overhead transport system according to claim 1, wherein the second placement part is arranged above an upper end of the article placed on the first placement part.

8. The overhead transport system according to claim 7, wherein the first placement part and the second placement part are each provided on a frame suspended from the ceiling.

9. The overhead transport system according to claim 1, wherein the second placement part is arranged at the same position as that of the first placement part in a direction along the track.

10. The overhead transport system according to claim 9, wherein the first placement part and the second placement part are each provided on a frame suspended from the ceiling.

11. The overhead transport system according to claim 1, wherein the first placement part and the second placement part are each provided on a frame suspended from the ceiling.

12. An overhead transport vehicle used for the overhead transport system according to claim 1.

13. An overhead transport system comprising:
    a track installed on a ceiling or in a vicinity of the ceiling;
    an overhead transport vehicle that travels along the track and includes an article holder that holds an article, a lift driver that lifts or lowers the article holder, and a lateral extender capable of projecting the article holder and the lift driver toward a side of the track;
    a first placement part arranged below and on the side of the track, that can have placed thereon an article held by the article holder in a state where the article holder and the lift driver have been projected by a first projection length by the lateral extender, and is set to a height at which the article holder and the lift driver can be projected by a second projection length, which is longer than the first projection length, by the lateral extender while the article is held by the article holder, in a state where the article is placed thereon, and also articles do not interfere with each other when the article holder and the lift driver are projected;

a second placement part arranged below and on the side of the track and on an outer side of the first placement part, and can have placed thereon the article held by the article holder in a state where the article holder and the lift driver have been projected by the second projection length by the lateral extender; and a third placement part arranged directly below the track and can have placed thereon an article held by the article holder, wherein a distance from the track in a horizontal direction to the second placement part is larger than a distance from the track in a horizontal direction to the first placement part, the first placement part, the second replacement part and the third placement part are arranged at the same height, and at a single position where the overhead transport vehicle stops, the article can be transferred to any of the first, the second, and the third placement parts.

14. The overhead transport system according to claim 13, wherein the second placement part is arranged at the same position as that of the first placement part in a direction along the track.

15. An overhead transport vehicle used for the overhead transport system according to claim 13.

16. The overhead transport system according to claim 13, wherein the first placement part is arranged lower, by more than a total height of two of the articles, than a reference, which is the article holder in a state of being projected toward the side of the track by the first projection length.

17. The overhead transport system according to claim 16, wherein a plurality of the first placement parts are arranged toward the side of the track.

18. The overhead transport system according to claim 13, wherein a plurality of the first placement parts are arranged toward the side of the track.

19. The overhead transport system according to claim 13, wherein the first placement part and the second placement part are each provided on a frame suspended from the ceiling.

* * * * *